United States Patent
Maerz

(10) Patent No.: US 7,705,998 B2
(45) Date of Patent: Apr. 27, 2010

(54) METHOD FOR EVALUATING AN OPTICAL IMAGING PROCESS

(75) Inventor: Reinhard Maerz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 296 days.

(21) Appl. No.: 11/854,017

(22) Filed: Sep. 12, 2007

(65) Prior Publication Data

US 2009/0066951 A1 Mar. 12, 2009

(51) Int. Cl.
*G01B 9/02* (2006.01)

(52) U.S. Cl. ...................... 356/515; 356/485

(58) Field of Classification Search ................ 356/124, 356/491, 492, 515, 495
See application file for complete search history.

(56) References Cited

U.S. PATENT DOCUMENTS

| | | | |
|---|---|---|---|
| 6,839,132 B2 | 1/2005 | Fukuhara et al. | |
| 7,057,737 B2* | 6/2006 | Millerd et al. | 356/495 |
| 7,468,798 B2* | 12/2008 | Shiode | 356/495 |
| 2006/0028706 A1 | 2/2006 | Totzeck et al. | |
| 2006/0203341 A1 | 9/2006 | Schuster | |

FOREIGN PATENT DOCUMENTS

DE 102005030543 A1 2/2006

OTHER PUBLICATIONS

Totzeck, M., et al., "Polarization influence on imaging," J. Microlith., Microfab., Microsyst., Jul.-Sep. 2005, pp. 031108-1-031108-15, 4(3), SPIE.

* cited by examiner

*Primary Examiner*—Hwa S. A Lee
(74) *Attorney, Agent, or Firm*—Slater & Matsil, L.L.P.

(57) ABSTRACT

A method includes calculating destructive interference conditions between two linearly s-polarized waves and between two linearly p-polarized waves, respectively, in dependence on varying parameters of the s- and p-polarized waves, representing the destructive interference conditions in a diagram, setting an optical radiation field to be used in the optical imaging process, and comparing the optical radiation field with the diagram.

20 Claims, 4 Drawing Sheets

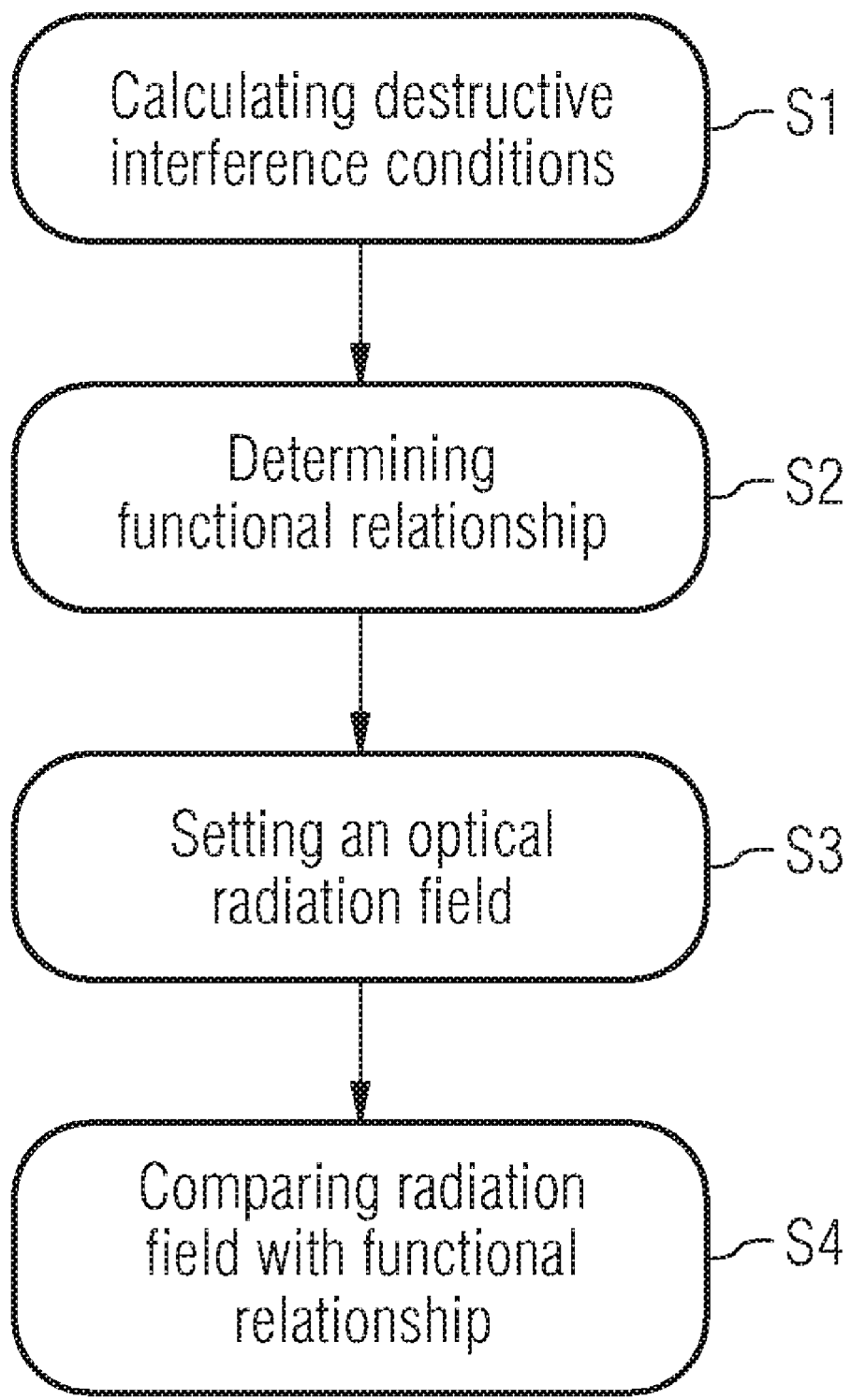

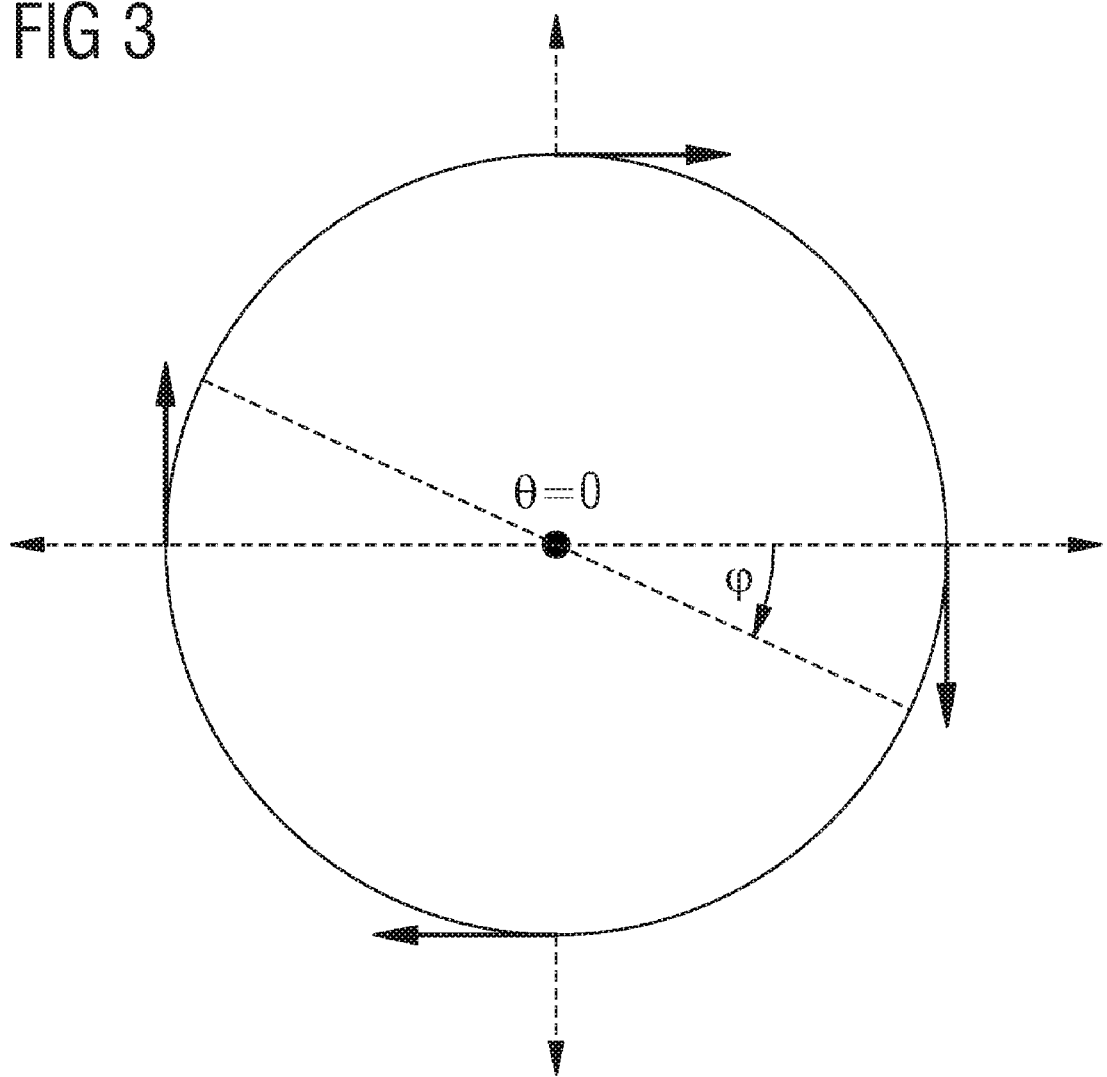

METHOD FOR EVALUATING AN OPTICAL IMAGING PROCESS

TECHNICAL FIELD

An embodiment of the present invention relates to a method for evaluating an optical imaging process.

BACKGROUND

Projection exposure machines are used for the photo-lithographic production of semiconductor components and other finely structured components. Their performance is substantially determined by the imaging properties of the projection optics. The image quality and the wafer throughput achievable with a machine are determined substantially by properties of the illumination system based upstream of the projection objective. In a projection exposure machine the pattern of a mask reticle is projected onto an object coated with a photo-sensitive layer, with maximum resolution on a reducing scale. In order to be able to generate finer and finer structures, attempts are made to constantly increase the numerical aperture (NA) on the image side of the projection objective, wherein values of NA=0.7 or more are achievable at present. Furthermore, shorter and shorter wavelengths in the deep ultra-violet (DUV) range or in the vacuum ultra-violet (VUV) range are being used.

In projection exposure machines used in the past, the illumination light could be regarded more or less as scalar light. Under conditions of short wavelengths and high numerical apertures, however, the influence of polarization effects on the imaging quality becomes increasingly important. With high numerical apertures, for example, at values of NA=0.85 or more, the vector character of the image-generating electric field becomes increasingly significant. It has been found, for example, that the s-polarized component of the electric field, i.e., the component which oscillates perpendicularly to the incidence plane spanned by the incidence direction and the surface normal of the substrate, interferes better and generates better contrast than the p-polarized component, oscillating perpendicularly to it. On the other hand, p-polarized light generally enters the photoresist better.

Therefore, it becomes more and more important to gain prior knowledge about imaging results to be expected in an optical imaging process when applying a particular optical radiation field to the process. In particular, it is desirable to gain knowledge about configurations of destructive interference of the optical waves or partial optical waves of an optical radiation filed for the selection of optimal adjustments of illumination parameters and for the determination of critical layout situations.

BRIEF DESCRIPTION OF THE DRAWINGS

Aspects of the invention are made more evident in the following detailed description of embodiments when read in conjunction with the attached drawing figures, wherein:

FIG. 2 shows a flow diagram of an embodiment of a method for evaluating an optical imaging process;

FIG. 3 shows a graphical representation for illustrating the way of plotting the two Euler angles $\phi$ and $\theta$.

DETAILED DESCRIPTION OF ILLUSTRATIVE EMBODIMENTS

Figure 1A:
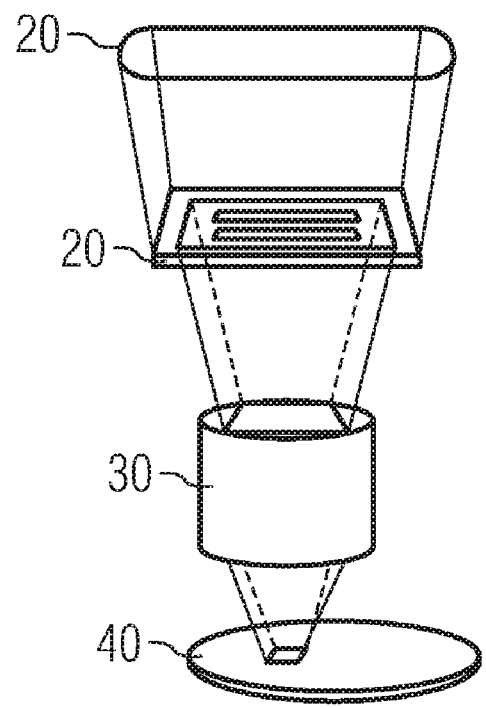
FIG. 1A shows a schematic representation of an example of an optical imaging process.

Referring to FIG. 1A, there is shown a schematic representation of an example of an optical imaging process. A radiation source 10, e.g., a Hg Arc Lamp for producing UV radiation, is used for generating the radiation for the optical imaging process. The radiation is directed towards and transmitted through a mask reticle 20 comprising a pre-fabricated pattern of lines and spaces to be projected onto a wafer 40. An optical system 30 is used to produce a demagnified image of the line pattern of the mask reticle 20 onto the wafer 40. The wafer 40 can be connected to a movable x-y table and a wafer stepper so that in a step-and-repeat procedure a plurality of chips can be processed on the wafer 40.

The optical imaging process can be used, as one example, in the formation of an integrated circuit. During semiconductor fabrication, a photoresist layer is formed over the surface of wafer 40. The photoresist is then selectively exposed by radiation from the radiation source 10 as patterned by mask reticle 20. Either exposed or unexposed portions of the photoresist can then be removed thereby exposing the underlying wafer 40. This exposed portion can then be modified, for example by etching or implantation or other process.

Referring to FIG. 2, there is shown a flow diagram of an embodiment of a method for evaluating an optical imaging process. In a first step s1 destructive interference conditions between at least two linearly s-polarized waves and between at least two linearly p-polarized waves, respectively, are calculated in dependence on varying parameters of the s- and p-polarized waves. In a second step s2 a functional relationship of the destructive interference condition is determined. In step s3 an optical radiation field to be used in the optical imaging process is determined or set. In step s4 the set optical radiation field is compared with the functional relationship.

In step s1 the destructive interference conditions can be calculated on a general basis by calculating scalar products of electrical polarization field vectors of two s-polarized waves and of two p-polarized waves, respectively, each of them with varying angle conditions between the vectors.

Figure 1B:
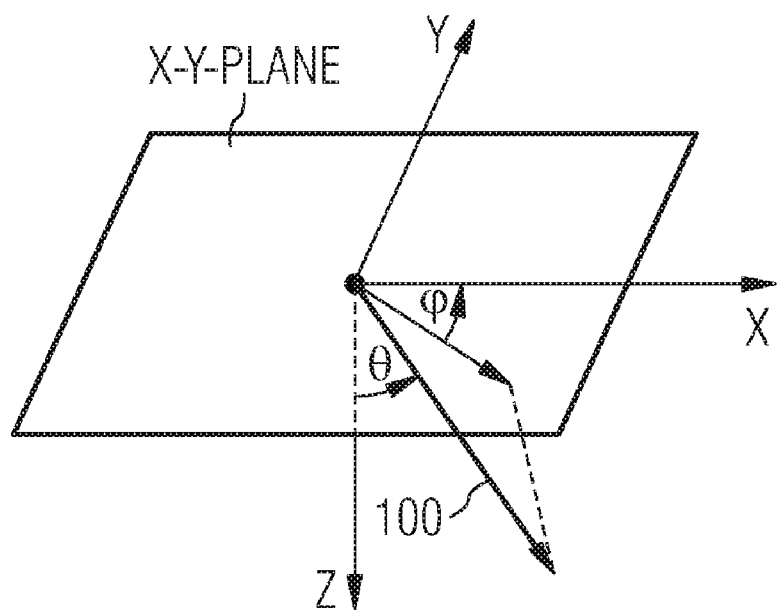
FIG. 1B provides an example of a coordinate system depicting the angles $\phi$ and $\theta$.

Furthermore, the destructive interference conditions can be calculated by varying Euler angles $\phi$ and $\theta$ of the s- and p-polarized waves, respectively, wherein $\phi$ is the azimuthal angle and $\theta$ is the zenithal angle of a coordinate system which is illustrated in FIG. 1B, wherein the coordinate system can be, for example, a pupil coordinate system. FIG. 1B shows an optical ray 100 (bold arrow). The zenithal angle $\theta$ lies between the optical ray and the z axis ($k_z \propto \cos \theta$). The azimuthal angle $\phi$ lies between the projection of the optical ray onto the x-y plane and the x axis.

The scalar products (also called inner products) of the electrical polarization field vectors can be calculated so that the following functions are obtained:

$$SP_{lm}^{(s)} = \cos(\phi^{(l)} - \phi^{(m)})$$

which is the scalar product for s-polarized waves, and $$SP_{lm}^{(p)} = \sin \theta^{(l)} \sin \theta^{(m)} + \cos \theta^{(l)} \cos \theta^{(m)} \cos(\phi^{(l)} - \phi^{(m)})$$

which is the scalar product for p-polarized waves, where l and m designate respective first and second interfering waves.

For determining the destructive interference conditions the functions $SP_{lm}^{(s)}$, $SP_{lm}^{(p)}$ have to be set equal to zero.

In an embodiment of the method, the step s2 of determining a functional relationship can comprise a step of representing the functional relationship of the destructive interference conditions in a diagram as will be outlined further below. In such a case the step s4 comprises comparing the optical radiation field with the diagram, in particular plotting a point or a plurality of points representing the optical radiation field in the diagram.

Figure 4:
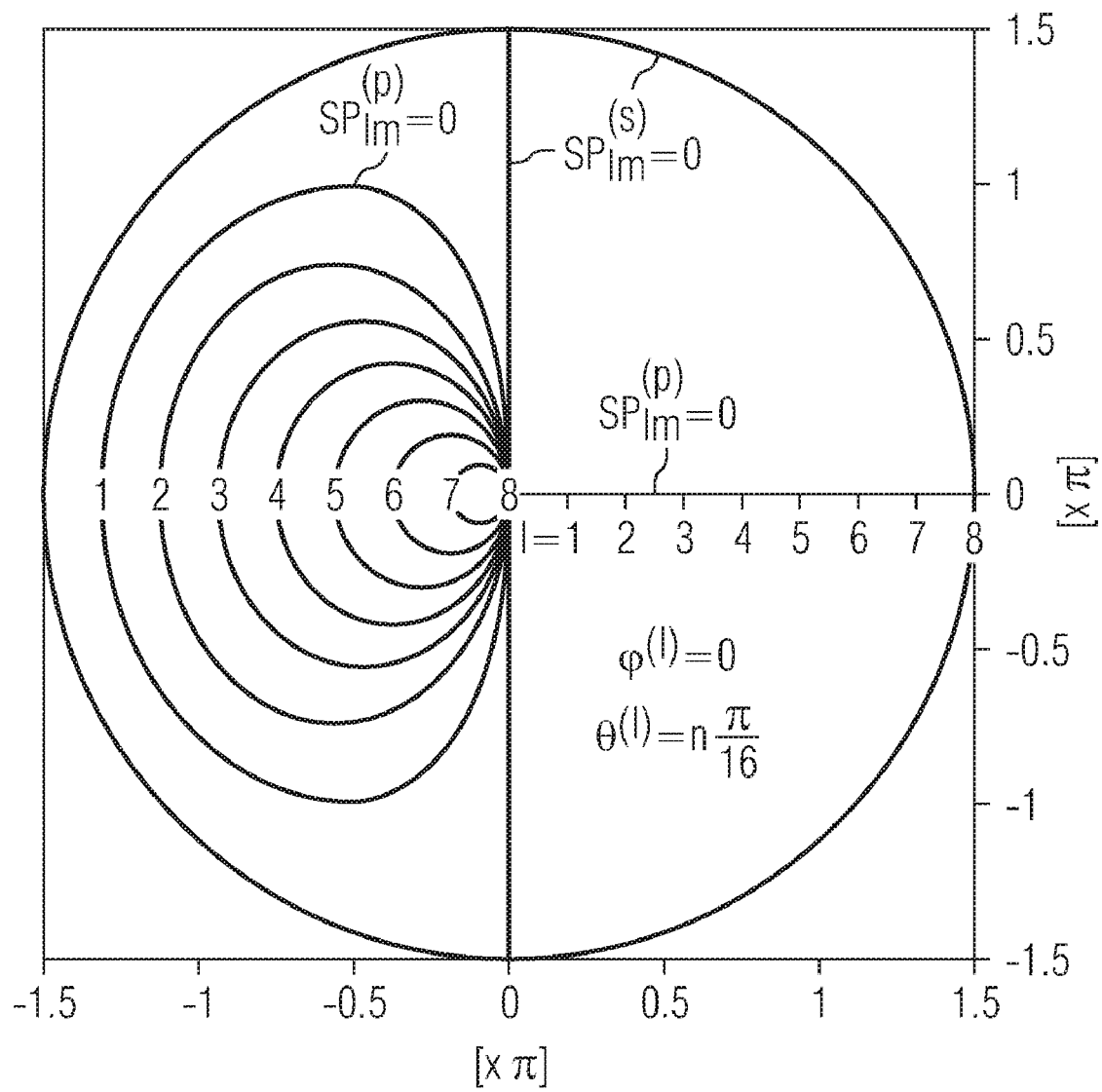
FIG. 4 shows an embodiment of a diagram for representing destructive interference conditions.

Referring to FIG. 3, there is shown a graphical representation for illustrating the way of plotting the angles $\phi$ and $\theta$ in the diagram as shown in FIG. 4. The dashed vector arrows pointing outwards designate $i_\theta$ and the continuous vector arrows along the circle designate $i_\phi$. The waves are split in s- and p-polarized waves with:

$$\vec{E}^{(s)} = E^{(s)} \vec{i}_\varphi$$

$$\vec{H}^{(p)} = H^{(p)} \vec{i}_\varphi.$$

The destructive interference of the two s-polarized waves or the two p-polarized waves occurs at zero points of the above functions $SP_{lm}^{(s)}$ and $SP_{lm}^{(p)}$.

In second step s2 of the method the destructive interference conditions as calculated in step s1 are represented in a diagram. Referring to FIG. 4, there is shown an embodiment of a diagram in which destructive interference conditions are depicted in a graphical form. The diagram is set up such that according to FIG. 3 the angle $\theta$ is plotted on the x-axis and the angle $\phi$ is plotted as a clockwise increasing coordinate. The destructive interference conditions are plotted in the diagram by fixing one of the angles $\phi$ or $\theta$ at a certain value and plotting values of the respective other angle so that for each pair of values of angles $\phi$ and $\theta$, the above functions $SP_{lm}^{(s)}$ or $SP_{lm}^{(p)}$ are equal to zero.

In step s3 an optical radiation field to be used in the optical imaging process is determined or set. If, for example, the method is run as a computer program, the optical radiation field can be set by inputting certain parameters which characterize the optical radiation field. These parameters can, for example, be input in an input mask which appears on a screen of a data processing system. The diagram as depicted in FIG. 4 may form the basis for the method for evaluating the optical imaging process with the user-defined optical radiation field. The given optical radiation field can be first analyzed like, for example, forming an angular spectrum of the electric polarization field distribution by way of calculating a Fourier transformation. Then, the result can be displayed in the diagram of FIG. 4 and it can be quickly determined whether the waves or partial waves of the given optical radiation field are, for example, localized on one of the curves in FIG. 4 or in the vicinity thereof which would indicate destructive interference.

Moreover, there can be defined particular mathematical conditions for detecting a critical situation in connection with a particular given optical radiation field. For example, it may be defined that a critical situation is detected if one or both of the following in-equations are met:

$|SP_{lm}| < SP^{(th)}$, $W_{lm} > W^{(th)}$ where $SP_{lm}$ is a scalar product of electrical polarization field vectors and $SP^{(th)}$ is a predetermined threshold value, and $$W_{lm} = \varepsilon_B |\vec{E}^{(l)}||\vec{E}^{(m)}| / P_{tot}^{(el)}$$

is the relative weight of the product of the amounts of the electrical field vectors $E^{(l)}$ and $E^{(m)}$ in relation to the total light power $P_{tot}^{(el)}$ of the optical imaging process, where $\in_B$ is the dielectric constant of the medium.

With the first one of the above in-equations a situation can be detected in which the scalar product of two electrical field vectors of two optical waves of the optical radiation field falls below a specified critical threshold value. If this situation occurs, an alarm signal can be output and in the diagram according to FIG. 4 a suitable marker can be generated and displayed at the respective position in the diagram. This marker may enable the user to change one or more of the parameters of the optical radiation field to see if the marker disappears in a further run of the software routine.

In one embodiment it can be the case that the marker is generated if the first one of the above in-equations is fulfilled. In a further embodiment it can be provided that the marker is only generated if the first in-equation and also the second in-equation is fulfilled. In this case a marker is only generated and displayed if not only the scalar product falls below the specified critical threshold value but also if the products of the amounts of the respective vectors is high enough so that its relative weight in relation to the total light power exceeds another specified critical threshold value. This second in-equation may thus help avoid the generation and display of markers in situations in which the strength of the respective vectors is so low that the destructive interference of them is of no significant harm for the optical imaging process.

In the above in-equations the power threshold $W^{(th)}$ is therefore a measure for the sensitivity of the method. Through the approximate selection of the threshold $SP^{(th)}$ it is possible to detect thresholds in a more or less large environment of a Fourier coefficient, i.e., partial waves with "similar" wave vector. This may become employed in combination with simulating "thick" masks, i.e., in case of the break-down of the Hopkins approximation, since in this case statements about incoherent illumination situations may be derived from one single coherent simulation.

It is equally possible to employ in-equations for detecting situations which are non-critical with respect to interference by, for example, forming in-equations which are inverse to the above in-equations:

$|SP_{lm}| > SP^{(th)}$, $W_{lm} < W^{(th)}$.

The method can be implemented by software or firmware and run on a data processing unit like, for example, any kind of computer systems. Accordingly, a further aspect relates to a computer program product which comprises program code sections for conducting the method as outlined above. A computer program product may be stored on a computer-readable recording medium and it may run on a digital signal processor (DSP), a microprocessor or a micro-controller after having been loaded into one of them.

What is claimed is:

1. A method for evaluating an optical imaging process, comprising:
   calculating destructive interference conditions between at least two linearly s-polarized waves and between at least two linearly p-polarized waves, respectively, in dependence on varying parameters of the s- and p-polarized waves;

determining a functional relationship of the destructive interference conditions;

setting an optical radiation field to be used in the optical imaging process; and comparing the optical radiation field with the functional relationship of the destructive interference conditions.

2. The method according to claim 1, wherein calculating destructive interference conditions comprises calculating scalar products of electrical field vectors of the two s-polarized waves and of the two p-polarized waves.

3. The method according to claim 1, wherein calculating destructive interference conditions comprises varying angles $\phi$ and $\theta$ of the s- and p-polarized waves, respectively, wherein $\phi$ is an azimuthal angle and $\theta$ is a zenithal angle of a pupil coordinate system.

4. The method according to claim 3, wherein calculating destructive interference conditions comprises calculating the scalar products as the following functions:

$$SP_{lm}^{(s)} = \cos(\phi^{(l)} - \phi^{(m)})$$

for s-polarized waves, and $$SP_{lm}^{(p)} = \sin\theta^{(l)} \sin\theta^{(m)} + \cos\theta^{(l)} \cos\theta^{(m)} \cos(\phi^{(l)} - \phi^{(m)})$$

for p-polarized waves, where l and m designate respective first and second interfering waves, and determining the destructive interference conditions by setting the functions $SP_{lm}^{(s)}$, $SP_{lm}^{(p)}$ equal to zero.

5. The method according to claim 1, wherein determining a functional relationship comprises representing the destructive interference conditions in a diagram.

6. The method according to claim 4, wherein calculating destructive interference conditions comprises:

setting up a diagram such that the angle $\theta$ is plotted on an x-axis of a x-y coordinate system and the angle $\phi$ is plotted as a clockwise increasing parameter; and representing the destructive interference conditions in the diagram by fixing one of the angles $\phi$ or $\theta$ at a certain value and plotting values of the respective other angle so that for each pair of values of angles $\phi$ and $\theta$, $SP_{lm}^{(s)}$ or $SP_{lm}^{(p)}$ is equal to zero.

7. The method according to claim 1, further comprising:

generating an angular spectrum of electric field polarization vectors of the waves of the set optical radiation field; and representing the angular spectrum of the waves or of partial waves of the optical radiation field in the diagram.

8. The method according to claim 7, wherein generating the angular spectrum comprises calculating a Fourier transformation of the electric field polarization vectors.

9. The method according to claim 7, further comprising:

detecting a critical situation if one or both of the following equations are met $$|SP_{lm}| < SP^{(th)} \tag{1}$$

$$W_{lm} > W^{(th)} \tag{2}$$

where $SP_{lm}$ is an inner product of electrical polarization field vectors and $SP^{(th)}$ is a predetermined threshold value, and $$W_{lm} = \varepsilon_B |\vec{E}^{(l)}||\vec{E}^{(m)}| / P_{tot}^{(el)}$$

is the relative weight of the product of the amounts of the electrical field vectors $E^{(l)}$ and $E^{(m)}$ in relation to total light power $p_{tot}^{(el)}$ of the optical imaging process, where $\varepsilon_B$ is a dielectric constant of the medium.

10. The method according to claim 9, further comprising:

displaying the diagram on a display screen; and in a situation in which equation (1) or both equations (1) and (2) are fulfilled generating and displaying a marker at a respective position of the diagram.

11. The method according to claim 9, further comprising:

detecting an uncritical situation instead of a critical situation, if one or both of the following equations are met $$|SP_{lm}| > SP^{(th)},$$

$$W_{lm} < W^{(th)}.$$

12. A computer program product stored on a computer-readable recording medium, the computer program product comprising code sections for conducting a method comprising:

calculating destructive interference conditions between at least two linearly s-polarized waves and between at least two linearly p-polarized waves, respectively, in dependence on varying parameters of the s- and p-polarized waves;

determining a functional relationship of the destructive interference conditions;

setting an optical radiation field to be used in the optical imaging process; and comparing the optical radiation field with the functional relationship of the destructive interference conditions.

13. A method for manufacturing a semiconductor device, the method comprising:

providing a semiconductor processing apparatus for performing an optical imaging process;

evaluating the optical imaging process by:

calculating destructive interference conditions between at least two linearly s-polarized waves and between at least two linearly p-polarized waves, respectively, in dependence on varying parameters of the s- and p-polarized waves;

determining a functional relationship of the destructive interference conditions;

setting an optical radiation field to be used in the optical imaging process; and comparing the optical radiation field with the functional relationship of the destructive interference conditions;

fabricating a semiconductor wafer using the semiconductor processing apparatus after evaluating the optical imaging process.

14. The method according to claim 13, wherein providing a semiconductor processing apparatus comprises providing a semiconductor processing apparatus comprising:

a radiation source;

a wafer stage for securing the semiconductor wafer; and a reticle mask disposed between the radiation source and the wafer stage.

15. The method according to claim 14, wherein fabricating the semiconductor wafer comprises:

forming a photoresist layer over a semiconductor wafer;

irradiating the photoresist layer with radiation from the radiation source via the reticle mask;

removing a portion of the photoresist to expose a portion of the wafer; and modifying the exposed portion of the wafer.

16. The method according to claim 15, wherein the modifying comprises etching.

17. The method according to claim 13, wherein calculating destructive interference conditions comprises calculating scalar products of electrical field vectors of the two s-polarized waves and of the two p-polarized waves.

18. The method according to claim 13, wherein calculating destructive interference conditions comprises varying angles $\phi$ and $\theta$ of the s- and p-polarized waves, respectively, wherein $\phi$ is an azimuthal angle and $\theta$ is a zenithal angle of a pupil coordinate system.

19. The method according to claim 13, wherein determining a functional relationship comprises representing the destructive interference conditions in a diagram.

20. The method according to claim 13, wherein evaluating the optical imaging process further comprises:

generating an angular spectrum of electric field polarization vectors of the waves of the set optical radiation field; and representing the angular spectrum of the waves or of partial waves of the optical radiation field in the diagram.

* * * * *